(12) United States Patent
Peterson

(10) Patent No.: US 6,385,070 B1
(45) Date of Patent: May 7, 2002

(54) CONTENT ADDRESSABLE MEMORY ARRAY, CELL, AND METHOD USING 5-TRANSISTOR COMPARE CIRCUIT AND AVOIDING CROWBAR CURRENT

(75) Inventor: LuVerne Peterson, San Diego, CA (US)

(73) Assignee: Tality, L.P., San Jose, CA (US)

( * ) Notice: Subject to any disclaimer, the term of this patent is extended or adjusted under 35 U.S.C. 154(b) by 0 days.

(21) Appl. No.: 09/805,388

(22) Filed: Mar. 13, 2001

(51) Int. Cl.$^7$ ................................................ G11C 15/00
(52) U.S. Cl. .......................................... 365/49; 365/204
(58) Field of Search .............................. 365/49, 189.07, 365/204

(56) References Cited

U.S. PATENT DOCUMENTS 5,917,743 A * 6/1999 Roy ............................ 365/49
5,930,161 A * 7/1999 Sheikholeslami et al. ..... 365/49

FOREIGN PATENT DOCUMENTS

JP 404011390 * 1/1992 ........... G11C/15/04

OTHER PUBLICATIONS

Betty Prince, "Semiconductor Memories", 1983, Wiley, $2^{nd}$ edition pp. 152–154.*

* cited by examiner

Primary Examiner—Trong Phan
Assistant Examiner—M. Tran
(74) Attorney, Agent, or Firm—Steven K. Barton

(57) ABSTRACT

A content addressable memory system has rows and columns of CAM cells. Each CAM cell has a data memory, and comparison circuitry for comparing the data bit of the memory element with a compare data, and for driving a signal onto a match line when the data bit is not equal to the compare data. The comparison circuitry has a mismatch node with a pre-discharge device, and drives a match line drive device coupled to the match line. The mismatch node also couples to a first comparison device having source an output of the data memory and gate coupled to the compare data, and a second comparison device having source a second output of the data memory and gate coupled to compare data. Disclosed is a ternary implementation of the CAM cell also having a mask bit. Also disclosed is CAM timing such that the CAM cells operate without crowbar current.

16 Claims, 4 Drawing Sheets

CONTENT ADDRESSABLE MEMORY ARRAY, CELL, AND METHOD USING 5-TRANSISTOR COMPARE CIRCUIT AND AVOIDING CROWBAR CURRENT

FIELD OF THE INVENTION

The Invention relates to the field of digital integrated circuits, and in particular relates to the design of static CMOS Content-Addressable Memory (CAM) arrays. CAM arrays are a form of associative memory. In particular, the invention relates to cells and CAM arrays having bit cells capable of storing three or more content states including: "logic one", "logic zero", and at least one form of "don't care"; such CAM arrays are known as ternary CAMs.

BACKGROUND OF THE INVENTION

CMOS CAM arrays are commonly used in cache systems, and other address translation systems, of high speed computing systems. They are also useful in high-speed network routers, and many other applications known in the art of computing.

CAM arrays are characterized by circuitry capable of generating a "match" output indicating whether any location of the array contains a data pattern matching a query input, and the identity of that location. CAM arrays typically are comprised of multiple rows, each row having multiple cells. Each cell of the array typically has the ability to store a unit of data, and the ability to compare that unit of data with a unit of a query input. Compare result indications of cells of each row are combined to produce a "match" signal for the row. Match signals from each row of the multiple rows together constitute the match output of the array; these signals may be encoded or used to select data from rows of additional memory.

Cells of a row typically are also connected to a common write line. The common write line allows enabling of simultaneous data writing to each cell of the row from a set of data input, or data input-output, lines.

Each cell of a CAM array is located within a column of cells of the array. Cells of a column are connected to a common unit of the query input, and are typically also connected to a common set of data input lines for writing data to cells of the array. Writing of a cell of the array typically requires that the data input lines for the cell's column be driven to a desired data value while the write line for the cell's row is activated. The data input lines may or may not be common with the query input lines of a cell depending upon the cell design used.

The unit of data stored in a CAM array is often binary, having two possible content states: logic one, and logic zero. Cells of these arrays produce a match compare result if the query input is equal to the data stored in the cell, and a mismatch result otherwise. CAM arrays are known that can store three or more states: logic one, logic zero, and don't care. Cells of these "ternary CAM" arrays produce a match compare result if the query input is either equal to the data stored in the cell, or the cell contains a don't care state, and a mismatch result otherwise.

Ternary CAM can be implemented with cells storing two binary bits, comprising a data bit and a mask bit, in memory elements of the cell. Two binary bits gives four possible states per cell: logic one, logic zero, and two possible don't-care states don't-care-one, and don't-care-zero. Binary and three-state (or ternary) static CMOS CAM cells of this type have been described in U.S. Pat. No. 6,044,005, the disclosure of which is hereby incorporated herein by reference.

Ternary CAM arrays are particularly useful in address translation systems that allow variably sized allocation units. Ternary CAM arrays are particularly useful for storing routing tables of network routers and switches.

Network routers typically receive, and retransmit, packets (packets are also known as frames in the context of Fibre Channel networks) having destination address fields of width 32 to 64 bits. Routers typically extract these address fields and use them to determine the appropriate port for retransmission. Determination of the appropriate port is typically performed by looking up the destination address in a routing table.

It is often impractical to allocate sufficient RAM memory to a routing table to permit accessing the table by using the destination address as a RAM address; ternary CAM can be used to construct a routing table having much less memory than would be required if the entire destination address were used as a RAM address. Ternary CAM is particularly useful in constructing fast routing tables for use in routing packets according to the TCP-IP and Fibre-Channel protocols.

CAM cells may store their data in either dynamic or static storage cells as known in the art of memory circuitry. Static storage offers the advantage that refresh circuitry is not required, and the advantage that true and complement signals may be drawn from each storage cell. Ternary Static CMOS CAM cells are known, including those illustrated in U.S. Pat. No. 6,044,005, that utilize a pair of six-transistor CMOS static RAM cells as memory elements for storing a mask bit and a data bit.

It is known that combining compare results of multiple cells of a row can be done in several ways. FIG. 1 (labeled "prior art") of U.S. Pat. No. 6,044,005 illustrates a parallel pulldown configuration, wherein match line ML, connected to all cells of a row, is driven low by device T4 of any cell having a mismatch compare condition. With the parallel pulldown configuration, a match for a row occurs whenever no cell of the row is driving match line ML low. FIG. 6B of U.S. Pat. No. 6,044,005 illustrates a series-string configuration, wherein transmission device T6 couples match line ripple-input ML0 to match line ripple-output ML1 when a match compare condition occurs. The match line ripple-output of each cell (except for the last cell of the row) is connected to the match line ripple-input of a following cell of the row. With this series-string configuration, a match for a row occurs when all cells couple ripple-input to ripple-output. FIG. 8 of U.S. Pat. No. 6,175,514 illustrates a full-complimentary-combiner-gate configuration, wherein compare result signals from each cell are combined by full-complimentary CMOS NAND and NOR gates to generate a row match signal.

The full-complimentary-combiner-gate configuration is fast, but can consume more room on an integrated circuit than may be desirable. The series-string configuration can be slower than desirable. The parallel pulldown configuration can produce mismatch results quickly, but pullup devices required to drive match lines ML of U.S. Pat. No. 6,044,005 FIG. 1 high can consume considerable power.

Operating voltage of modern CMOS integrated circuits is trending downward. There several reasons for this, among them are power conservation and compatibility with newer, submicron, process technology. It has been observed that some existing CAM core cells, including that illustrated in FIG. 1 of U.S. Pat. No. 6,044,005, have single-ended pass circuitry that drops a signal by a threshold voltage prior to driving the gate of a transistor T4 on a critical speed path. As operating voltages decrease, it is advisable to avoid pass gate signal voltage drops on speed-critical devices.

SUMMARY OF THE INVENTION

A CAM core cell has been designed capable of storing two binary bits, comprising a data bit and a mask bit. This cell can take on a total of four possible states: logic one, logic zero, and two possible don't-care states: don't-care-one, and don't-care-zero. The cell contains comparison circuitry for detecting match conditions against a query signal, and for pulling down a match line of parallel-pulldown configuration when a mismatch occurs. The comparison circuitry avoids single-ended pass-gate signal voltage drops on speed-critical devices, and avoids crowbar current during transitions of the compare data and compare data complement lines.

An array of the CAM core cells is operated in conjunction with control logic, controlled match line pullups, and query signal driver logic. The control logic controls a precharge signal to the CAM core cell, the controlled match line pullups, and the query signal driver logic to prevent simultaneous conduction of the controlled pullup and match line pulldowns of the cells.

The CAM core cell array has five hundred twelve rows of sixty-eight cells each, and is utilized for a routing table in a network router. It is anticipated that the present invention is applicable to CAM core cell arrays of different dimensions, and for CAM core cell arrays used for other purposes.

DETAILED DESCRIPTION OF THE EMBODIMENTS

A ternary-CAM bit cell design as known in the art has a data static-random-access-memory (SRAM) element 100 (FIG. 1) and a mask SRAM element 102. SRAM elements 100 and 102 may be six transistor static RAM elements as known in the art and illustrated in FIG. 1B. Alternatively, SRAM elements 100 and 102 may be four-transistor-plus-two-resistor "poly load" static RAM elements as known in the art. A number of these bit cells are formed into an array, as depicted in FIG. 1A, having a plurality of rows and a plurality of columns. The data SRAM element 100 (FIG. 1) and mask SRAM element 102 have write enable inputs that are coupled to a write line WL common to several cells, such as WL0 common to cells 150 and 154, of a row. The data SRAM element 100 of each cell is coupled to data DBL and data complement DBLB input/output lines common to several cells of a column, such as DBL0 and DBLB0 common to cells 150 and 152. The mask SRAM element 102 is coupled to mask MBL and mask complement MBLB input/output lines common to several cells of a column, such as MBL0 and MBLB0 common to cells 150 and 154.

Figure 1:
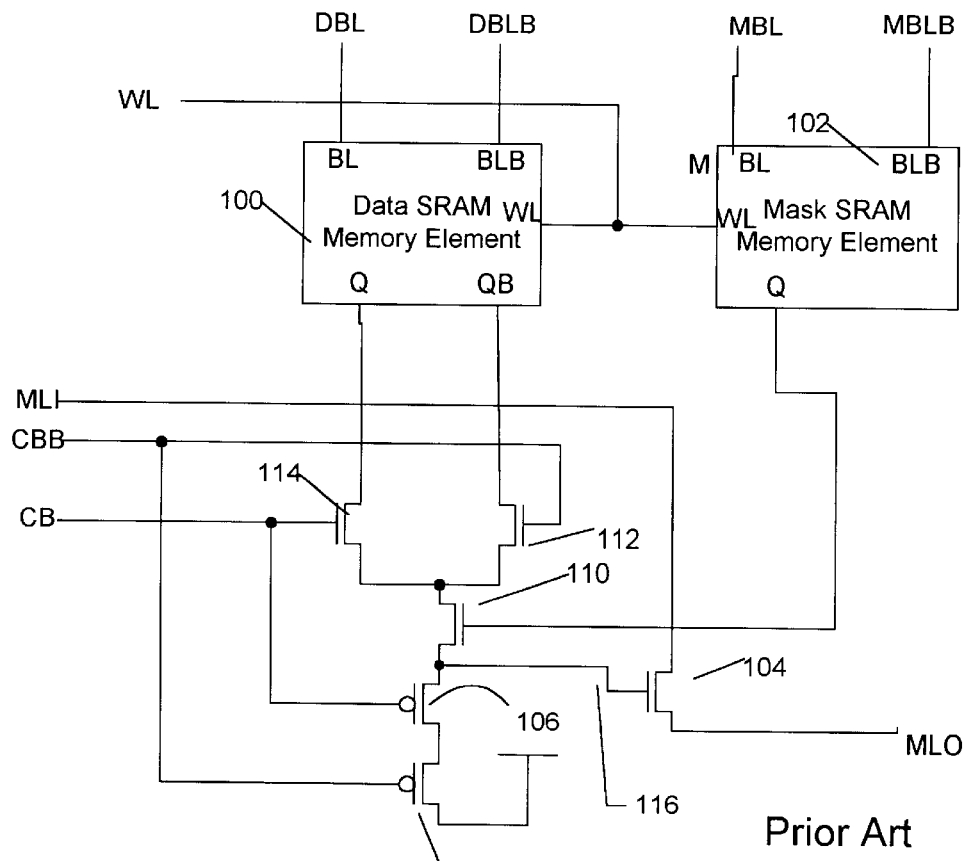
FIG. 1 is a schematic diagram of a prior-art CAM core cell design.
Figure 1A:
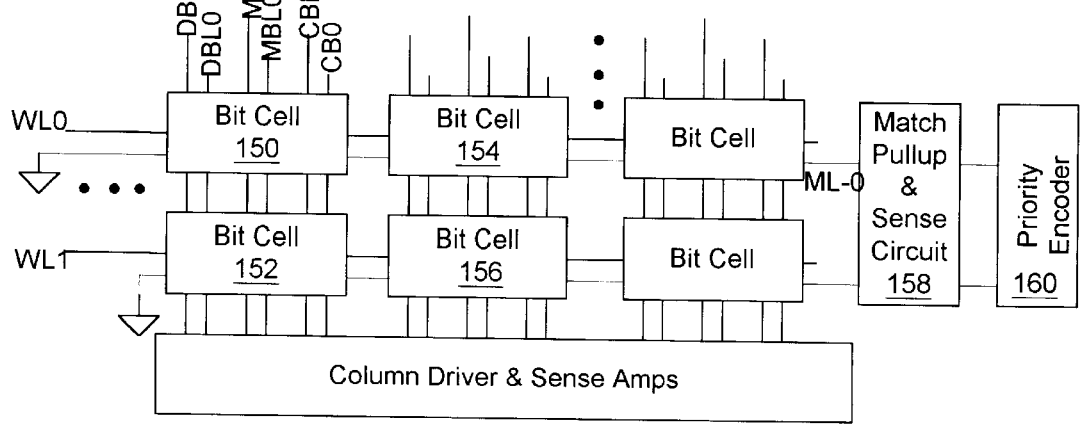
FIG. 1A, a schematic diagram of an array of CAM core cells.

Each cell also has a match line input MLI and match line output ML0 (FIG. 1). The match lines are strung in series, ML0 of a first cell, such as cell 150 (FIG. 1A), is coupled to MLI of a second cell, such as cell 154, to form an overall match line ML-0. Each match line of the array, such as match line ML-0, is coupled to a precharge and sense circuit 158, and to output logic such as a priority encoder 160.

The cell has compare data CB (FIG. 1) and compare data complement CBB inputs. These inputs are common to several cells of a column, such as CB0 and CBB0 (FIG. 1A) coupled to cells 150 and 152. Each cell also has six devices, 104, 106, 108, 110, 112, and 114 for detecting a match and for driving the match line ML with a mismatch indication if no match is detected.

Devices 106 and 108 pull up, or precharge, a mismatch node 116 whenever both the compare data CB and compare data complement CBB input lines are low. When the cell is queried, one and only one of the compare data CB and compare data complement CBB lines is raised to indicate compare data, this turns off precharge of the mismatch node 116. Mismatch node 116 is then permitted to discharge through devices 112, 114, and 110 if the data memory element 100 contents matches the compare data, and the mask memory element contains a logic one.

It is known that the compare data CB and compare data complement CBB lines do not switch instantaneously, they rise or fall over a small but finite transition time. During this transition time, there may be an undesirable current, known as a crowbar current, through precharge devices 108, and 106, mask device 110, one of the comparison devices 112 and 114, and a pulldown device 170 or 176 (FIG. 1B) of the data memory element 100 (FIG. 1). An array of these cells can also be slow because of the series match line.

Figure 1B:
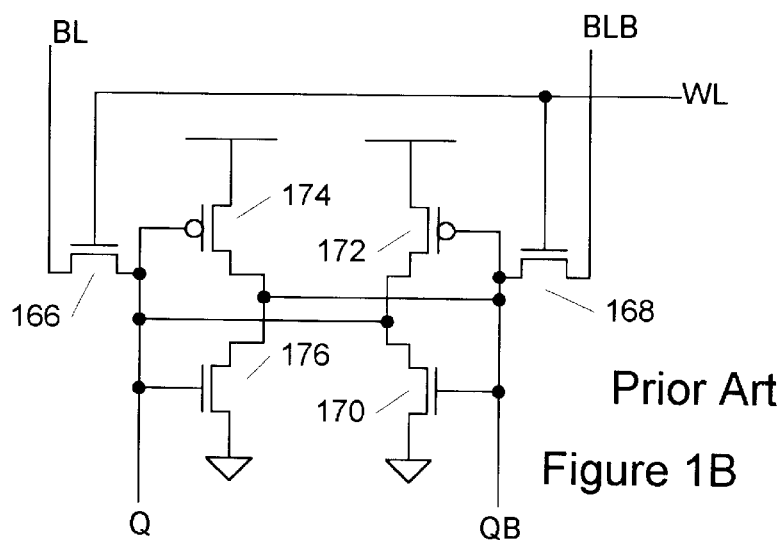
FIG. 1B, a schematic diagram of a CMOS memory element of a CAM core cell.

A CAM cell embodying the present invention (FIG. 2) has a match line ML typically coupled to two or more cells. Each cell also has a static memory element 200 for storing a data bit and a static memory element 202 for storing a mask bit, these memory elements are of the six transistor static type as illustrated in FIG. 1B. Alternatively, the cell may use memory elements of the four transistor plus two resistor "poly load" type known in the art. The cell also has compare circuitry for comparing the data bit against compare inputs and for driving the match line.

The compare circuitry includes a mask transistor 204, having an output of mask bit memory element 202 driving its gate, in series with a compare pulldown transistor 206. The gate of compare pulldown transistor 206 is driven by a mismatch node 207. Mismatch node 207 has a pre-discharge transistor 208 controlled by pre-discharge cell input CBDIS and first 210 and second 212 compare transistors. First compare transistor 210 has a gate driven by true compare data input CB, and source driven by a complement data output of data bit memory element 200. Second compare transistor 212 has a gate driven by a complement compare data input CBB, and source driven by a true data output of data bit memory cell 200.

Figure 2:
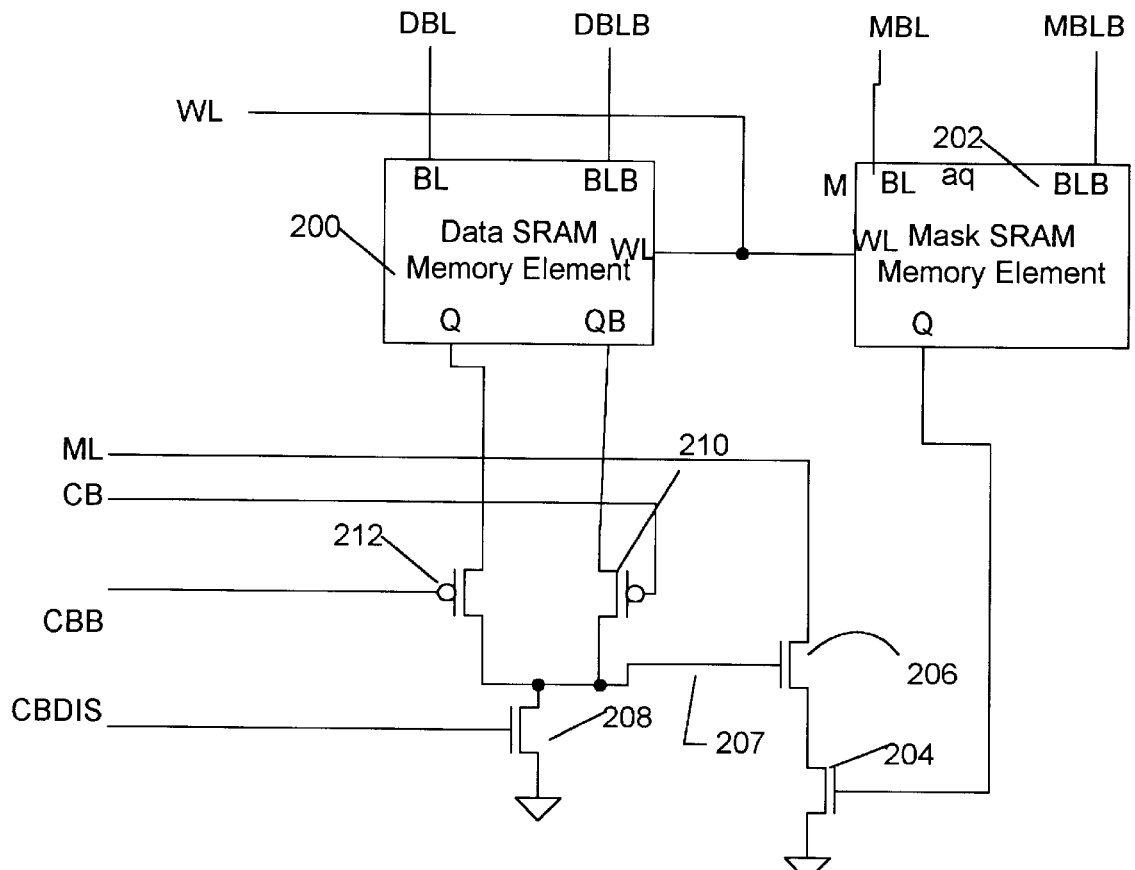
FIG. 2. a schematic diagram of the CAM core cell of the present invention.
Figure 3:
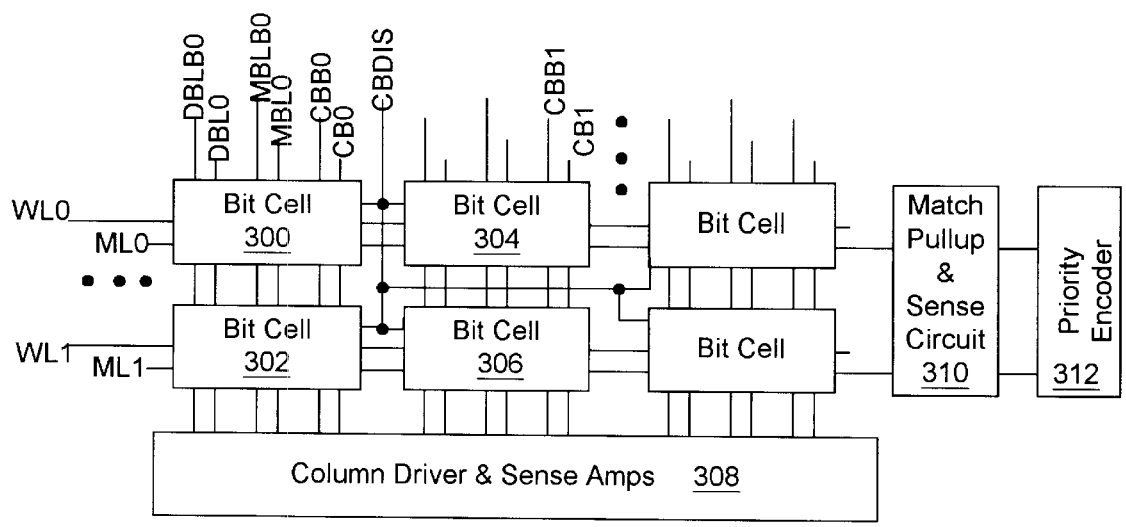
FIG. 3, a schematic diagram of a CAM array using the CAM core cell of the present invention.

The CAM cells of FIG. 2 are placed in an array, FIG. 3, having the CBDIS input of all cells, including all rows and columns, driven together. Write lines WL, and match lines ML of cells in the same row, are coupled into row write and row match lines, illustrated as WL0 and ML0 for the row having cells 300 and 304, or WL1 and ML1 for the row having cells 302 and 306. Write lines WL are driven by a row address decoder, not shown. Data DBL and data complement DBLB, mask MBL and mask complement MBLB, and compare data CB and complement CBB lines of cells of the same column, such as cells 300 and 302, are coupled into corresponding column lines, illustrated as DBLB0, DBL0, MBL0, MBLB0, CB0, and CBB0, and to a column driver and sense amplifier block 308. Similarly, CBB1 and CB1 are the compare data complement and compare data lines of the column containing bit cells 304 and 306. Row match lines, such as ML0 and ML1, are coupled to a match line pullup and sense circuit 310, and may be coupled to a priority encoder 312.

Ternary data is written to a row of the array by placing data on the data DBL and data complement DBLB inputs of all cells, mask information on the mask MBL and mask complement inputs of all cells, and then pulsing the write line WL of the cells of a particular row, such as WL0, high. If a cell is to match only to a query of a one, the mask memory element 202 is written to a one and the data memory element 200 to a one. If a cell is to match only to a query of a zero, the mask memory element 202 is written to a one and the data memory element 200 to a zero. If a particular cell is to be ignored during query operations, the mask memory element 202 is written to a zero, in this event the data memory element 200 may be written to anything pleasing to the designer.

Figure 4:
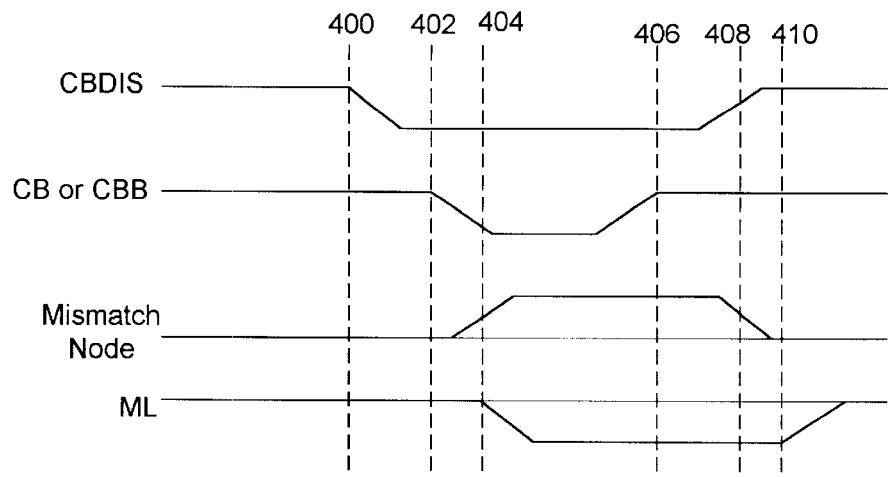
FIG. 4, a timing diagram illustrating operation of the CAM.

With reference to FIGS. 2, 3, and 4, during a query operation, the match line pullup and sense circuit 310 initially precharges all match lines, such as match lines ML0 and ML1, high. During this time, the match detect circuit pre-discharge line CBDIS is held high to discharge all mismatch nodes 207 to ground, and all compare data and compare data complement lines of the array, such as CB0, CB1, CBB0, and CBB1 are held high and thus inactive. At or prior to time 400 (FIG. 4), this match line pullup and sense circuit 310 stops precharging the match lines, and the pre-discharge line CBDIS is turned off.

After pre-discharge line CBDIS is low, selected compare data and compare data complement lines, such as CB0 and CBB1, are pulled low at 402. Note that only one compare data or compare data complement line in each column may be pulled down simultaneously, which is pulled down depends on compare data. Both the compare data and compare data complement lines of particular columns may be left high if that column is to be ignored in the comparison.

The fall of the selected compare data and compare data complement lines may cause a mismatch node of any or all cells to rise at 404, causing the match lines ML connected to those cells to discharge. Those match lines that discharge are recorded by the match pullup and sense circuit 310 and/or the priority encoder 312 as not matching, while those that remain high are recorded as matching the query.

The compare data and compare data complement lines, such as lines CB0, CB1, CBB0, and CBB1, are all driven high, and thus inactive, at 406, this may be before or after the match lines are sensed since the match lines will hold information for a short time. After the compare data and compare data complement lines are all high, the match detect pre-discharge line CBDIS is driven high at 408 to discharge all mismatch nodes 207. Once the match lines are sensed, and all mismatch nodes 207 are discharged, the match pullup and sense circuit 310 drives all match lines, such as match lines ML0 and ML1, high at 410.

Operated in this way, the ternary CAM cells of the present invention do not draw crowbar current.

Since a CAM is not generally written at the same time its contents are queried, it is possible to reduce interconnect by sharing the compare data with either data or mask input/output lines. If this is done, crowbar current may be prevented by turning off the CBDIS line during the write operation.

It is known that speed of large distributed NOR gates, such as the match lines ML0 and ML1 of a large array, can sometimes be enhanced by inserting buffers. This may be done by breaking the match lines into shorter partial match lines that each couple to the match detect circuitry of several cells of the row. Each partial match line has its own match line pullup circuitry. A buffer is then inserted between a first partial match line of a row and a second partial match line of the same row, such that a mismatch of the first partial match line causes the second partial match line to also be driven to a mismatch. A full-array match indication may then be obtained by examining the second partial match line at the appropriate time.

It is expected that the Ternary CAM of the present design can also be implemented in complementary logic to that discussed. In doing so, each device illustrated in FIG. 2 as a P-channel device (210 and 212) is replaced by an N-channel device. Similarly, those devices illustrated as N-channel devices (208, 204, and 206) are replaced by P-channel devices. All the ground connections shown on FIG. 2 would be replaced by positive power connections. If this is done, the operating polarity of the CBDIS, CBB, CB, mismatch node 207, and match line ML are also reversed. The term "rail" means either a ground or a power connection as appropriate for the type of logic and polarity of signal used in a particular embodiment.

Figure 5:
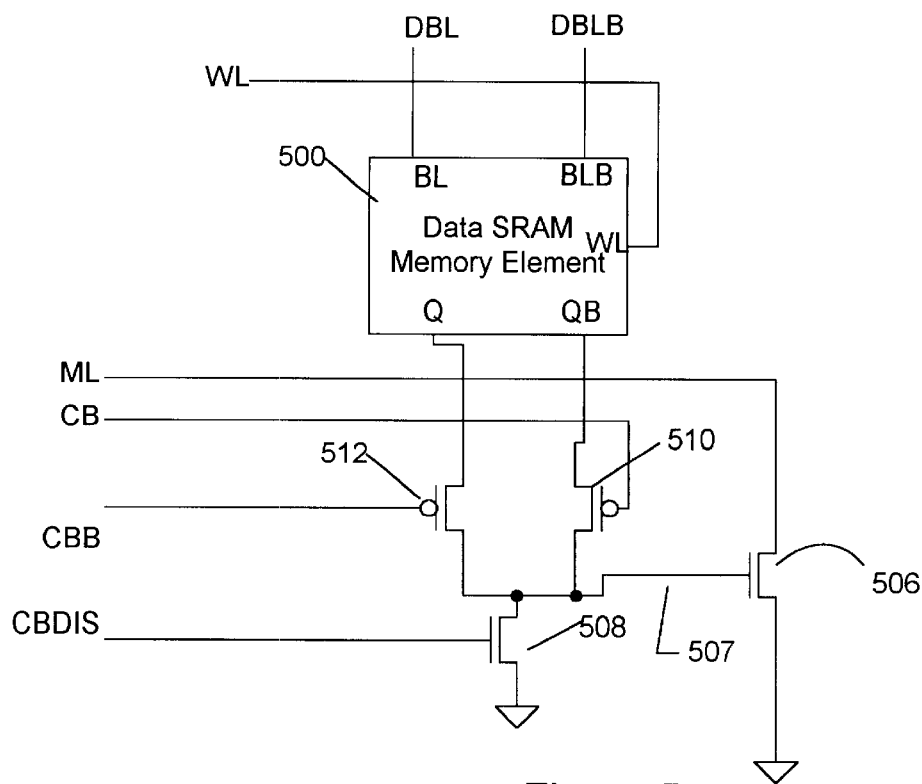
FIG. 5, a binary CAM cell of the present invention.

A binary CAM cell, as illustrated in FIG. 5 operates on similar principles and with the same timing as heretofore discussed. This has a match line ML typically coupled to two or more cells. Each cell also has a static memory element 500 for storing a data bit; these memory elements are of the six transistor static type as illustrated in FIG. 1B. Alternatively, the cell may use memory elements of the four transistor plus two resistor "poly load" type known in the art. The cell also has compare circuitry for comparing the data bit against compare inputs and for driving the match line.

The compare circuitry includes a compare pulldown transistor 506. The gate of compare pulldown transistor 506 is driven by a mismatch node 507. Mismatch node 507 has a pre-discharge transistor 508 controlled by pre-discharge cell input CBDIS and first 510 and second 512 compare transistors. First compare transistor 510 has a gate driven by true compare data input CB, and source driven by a complement data output of data bit memory element 500. Second compare transistor 512 has a gate driven by a complement compare data input CBB, and source driven by a true data output of data bit memory cell 500.

Figure 6:
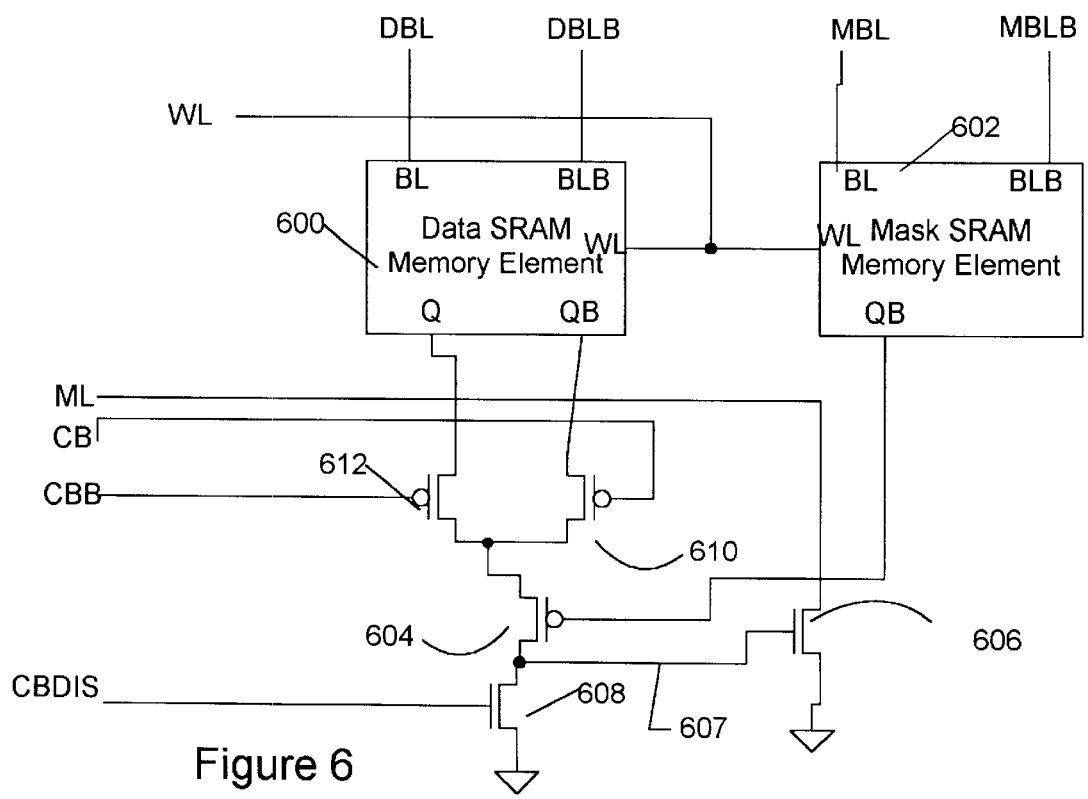
FIG. 6, an alternate embodiment having a mask transistor between comparison devices and match node.

An additional ternary embodiment has (FIG. 6) has a match line ML typically coupled to two or more cells. Each cell also has a static memory element 600 for storing a data bit and a static memory element 602 for storing a mask bit, these memory elements are of the six transistor static type as illustrated in FIG. 1B. Alternatively, the cell may use memory elements of the four transistor plus two resistor "poly load" type known in the art. The cell also has compare circuitry for comparing the data bit against compare inputs and for driving the match line.

The compare circuitry includes a mask transistor 604, having a complement output of mask bit memory element 602 driving its gate. Mask transistor 604 is coupled such that, if mask bit memory element 602 contains a zero, it prevents any mismatch signal from reaching a compare pulldown transistor 606. The gate of compare pulldown transistor 606 is driven by a mismatch node 607. Mismatch node 607 has a pre-discharge transistor 608 controlled by pre-discharge cell input CBDIS. Mismatch is detected by first 610 and second 612 compare transistors. First compare transistor 610 has a gate driven by true compare data input CB, and source driven by a complement data output of data bit memory element 600. Second compare transistor 612 has a gate driven by a complement compare data input CBB, and source driven by a true data output of data bit memory cell 600. The compare transistors are coupled to mismatch node 607 through the mask transistor 604.

While the invention has been discussed with reference to static memory elements, it is anticipated that dynamic memory elements, such as dynamic memory elements of three transistors could be used for storing the mask bits, and dynamic memory elements of five transistors could be used for storing the data bits.

While the invention has been particularly shown and described with reference to a preferred embodiment thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A content addressable memory system comprising: an array comprising a plurality of cells, the cells organized into at least one rectangular array having rows each comprising a plurality of cells and columns each comprising a plurality of cells, where each column has a compare data line and a compare data complement line, where each row has a match line, and wherein each cell is associated with a row and a column of the array and comprises:
    at least one memory element for storing a data bit, and
    comparison circuitry capable of comparing the data bit with compare data, and for driving a signal onto the match line of the associated row when the data bit is not equal to the compare data, the comparison circuitry comprising:
    a mismatch node,
    a pre-discharge device coupled to the mismatch node, a rail, and having a gate coupled to a pre-discharge signal,
    a match line drive device coupled to the match line, a rail, and having a gate coupled to the mismatch node,
    a first comparison device coupled to an output of the memory element for storing a data bit, the mismatch node, and having a gate coupled to the compare data line of the associated column, and
    a second comparison device coupled to a second output of the memory element for storing a data bit, the mismatch node, and having a gate coupled to a compare data complement line of the associated column.

2. The CAM system of claim 1 wherein at least some cells further comprise a memory element for storing a mask bit, and wherein the comparison logic of those cells further comprises a mask device for preventing the cell from discharging the match line dependent upon a state of the mask bit.

3. The CAM system of claim 2, wherein the mask device has a gate coupled to an output of the memory element for storing a mask bit, and wherein the mask device is coupled in series with the match line drive device.

4. The CAM system of claim 2, wherein the mask device is coupled between the first and second comparison devices and the mismatch node.

5. The CAM system of claim 1, wherein the memory element for storing a data bit of each cell comprises a static memory element.

6. The CAM system of claim 5 wherein at least some cells further comprise a static memory element for storing a mask bit, and wherein the comparison logic of those cells further comprises a mask device for preventing the cell from discharging the match line dependent upon a state of the mask bit.

7. The CAM system of claim 6, wherein the mask device has a gate coupled to an output of the memory element for storing a mask bit, and wherein the mask device is coupled in series with the match line drive device.

8. The CAM system of claim 6, wherein the match line drive device, the mask device, and the pre-discharge device are N-channel devices, and wherein the first and second comparison devices are P-channel devices.

9. The CAM system of claim 5, wherein a compare cycle is performed by performing the steps of:
    precharging the match lines associated with a plurality of rows;
    turning off the pre-discharge device of all cells of the plurality of rows;
    switching at least one of the compare data and compare data complement lines of at least one column to an active state;
    determining whether any match line of the match lines fails to discharge;
    switching all compare data and compare data complement lines to an inactive state; and
    turning on the pre-discharge device of all cells of the plurality of rows.

10. The CAM system of claim 9, wherein a compare cycle is performed by performing the steps of:
    precharging the match lines associated with a plurality of rows;
    turning off the pre-discharge device of all cells of the plurality of rows;
    switching at least one of the compare data and compare data complement lines of at least one column to an active state;
    determining whether any match line of the match lines fails to discharge; and
    switching all compare data and compare data complement lines to an inactive state.

11. The CAM system of claim 10 wherein at least some cells further comprise a memory element for storing a mask bit, and wherein the comparison logic of those cells further comprises a mask device for preventing the cell from discharging the match line dependent upon a state of the mask bit.

12. The CAM system of claim 11, wherein the mask device has a gate coupled to an output of the memory element for storing a mask bit, and wherein the mask device is coupled in series with the match line drive device.

13. A cell for a CAM system, the cell comprising
    a first memory element capable of storing a data bit;
    a second memory element capable of storing a mask bit;
    comparison circuitry for driving a signal onto a match line further comprising
    a pre-discharge device coupled to the mismatch node, a rail, and having a gate coupled to a pre-discharge signal,
    a match line drive device coupled to the match line, a rail, and having a gate coupled to the mismatch node,
    a first comparison device coupled to an output of the memory element for storing a data bit, the mismatch node, and having a gate coupled to the compare data line of the associated column, a second comparison device coupled to a second output of the memory element for storing a data bit, the mismatch node, and having a gate coupled to a compare data complement line of the associated column, and a mask device coupled in series with the match line drive device.

14. The CAM system of claim 13, wherein the match line drive device, the mask device, and the pre-discharge device are N-channel devices, and wherein the first and second comparison devices are P-channel devices, and wherein the rail coupled to the match line drive device is ground.

15. A method of performing a compare cycle in a ternary content addressable memory is performed by performing the steps of:

providing an array of cells having a plurality of rows and columns, where each cell is associated with a row and a column of the array, and each cell is coupled to a match line associated with a row, where each cell is coupled to a compare data line and a compare data complement line associated with the column associated with the cell, where each cell comprises:
a memory element for storing a data bit,
a pre-discharge device coupled to a mismatch node,
a match line drive device coupled to the match line associated with the row associated with the cell, and having gate coupled to the mismatch node,
a first match detect device coupled to the mismatch node, an output of the memory element for storing a data bit, and the compare data line coupled to the cell, and
a second match detect device coupled to the mismatch node, a second output of the memory element for storing a data bit, and the compare data complement line coupled to the cell;

precharging the match lines associated with a plurality of rows;

pre-discharging mismatch nodes of all cells of the plurality of rows;

switching at least one of the compare data and compare data complement lines of at least one column to an active state;

allowing cells having a mismatch condition to discharge the match line to which they are coupled;

determining whether any match line of the match lines fails to discharge; and switching all compare data and compare data complement lines to an inactive state.

16. The method of claim 15, wherein each cell further comprises:

a second memory element for storing a mask bit, and a mask device coupled to prevent discharge of the match line coupled to the cell if the mask bit is in a particular state.

* * * * *